United States Patent
Lee et al.

(10) Patent No.: US 6,838,753 B2
(45) Date of Patent: Jan. 4, 2005

(54) LEAD-FRAME STRIP AND METHOD OF MANUFACTURING SEMICONDUCTOR PACKAGES USING THE SAME

(75) Inventors: Sang-kyun Lee, Yongin (KR); Bong-hui Lee, Yongin (KR); Dong-hoon Lee, Yongin (KR)

(73) Assignee: Samsung Techwin Co., Ltd. (KR)

( * ) Notice: Subject to any disclaimer, the term of this patent is extended or adjusted under 35 U.S.C. 154(b) by 0 days.

(21) Appl. No.: 10/328,235

(22) Filed: Dec. 23, 2002

(65) Prior Publication Data

US 2003/0116833 A1 Jun. 26, 2003

(30) Foreign Application Priority Data

Dec. 21, 2001 (KR) ................................ 10-2001-0082487

(51) Int. Cl.[7] ............................................ H01L 23/495
(52) U.S. Cl. ...................... 257/666; 257/670; 257/676
(58) Field of Search .................................. 257/666–677

(56) References Cited

U.S. PATENT DOCUMENTS 5,424,576 A * 6/1995 Djennas et al. ............. 257/666
6,400,004 B1 * 6/2002 Fan et al. .................... 257/666

* cited by examiner

Primary Examiner—Cuong Nguyen
(74) Attorney, Agent, or Firm—St. Onge Steward Johnston & Reens LLC

(57) ABSTRACT

Provided are a lead frame strip and a method of fabricating a semiconductor package using the same. The lead frame strip includes at least one lead frame panel in which a plurality of unit lead frames are arranged to be connected with one another in matrix forms, wherein each unit lead frame includes: a die pad to which a semiconductor chip is to be mounted; a tie bar, an end of which being connected to the die pad and processed to be downset; a plurality of leads positioned at the same level as another end of the tie bar and extended with a predetermined distance from the tie pad; a dam bar formed across the leads and united with the leads to support the leads, wherein a slot is formed along edges of the lead frame panel and functions as a buffer, and a connection bar is formed widthwise across the slot to support the lead frame panel.

13 Claims, 6 Drawing Sheets

FIG. 3 (PRIIOR ART)

LEAD-FRAME STRIP AND METHOD OF MANUFACTURING SEMICONDUCTOR PACKAGES USING THE SAME

BACKGROUND OF THE INVENTION

This application claims the priority of Korean Patent Application No. 2001-82487, filed on Dec. 21, 2001 in the Korean Intellectual Property Office (KIPO), which is incorporated herein in its entirety by reference.

FIELD OF THE INVENTION

The present invention relates to a lead-frame strip and a method of fabricating a semiconductor package using the same, and more particularly, to a lead-frame strip capable of suppressing generation of mold flash during molding of a package and a method of fabricating a semiconductor package using the lead frame.

DESCRIPTION OF THE RELATED ART

FIG. 1 is a cross-sectional view of a conventional semiconductor package, and FIG. 2 is a perspective view of a schematic structure of a unit lead frame used in fabricating semiconductor packages such as semiconductor package 10 of FIG. 1.

Semiconductor package 10 shown in FIG. 1 is of a type called a smart metal chip scale package (SMCSP). A die pad 12 forms an upper portion of the semiconductor package 10 and a semiconductor chip 11 is attached to the bottom of the die pad 12 in the semiconductor package 10. With respect to FIG. 2, the die pad 12 is supported by tie bars 15. In detail, the tie bars 15 are processed to be downset at corners of the die pad 12 into a shape extending downward between the die pad 12 and the leads 20 (or dam bars 30) positioned at a level lower than the die pad 12. Also, a plurality of leads 20 are formed between the tie bars 15. The leads 20 and the die pads 12 are connected to the semiconductor chip 11 via bonding wires 21 and 22, respectively. Then encapsulant 25 is applied to enclose the semiconductor chip 11, the tie bars 15, the leads 20, and the sides and the bottom of the die pad 12. In FIG. 2, reference numerals 16 and 30 denote holes and a dam bar, respectively, and their detailed descriptions will be later described.

General methods of fabricating a semiconductor package using the lead frame of the kinds described above include: an individual trimming method through which a lead frame mounted with a semiconductor chip is individually molded; and a matrix array package (MAT) method through which a matrix-type lead frame strip mounted with a plurality of semiconductor chips is molded and then severed. Because the manufacturing cost of a unit semiconductor package when using the individual trimming method is higher than the manufacturing cost associated with the MAT method, the former method is not frequently used.

FIG. 3 is a plan view of a portion of a lead frame strip used in the conventional MAT method. More specifically, FIG. 3 shows an enlarged view of the lead frame matrix.

Referring to FIG. 3, a unit lead frame is a structure in which a die pad 12, tie bars 15, and a plurality of leads 20 are formed. Dam bars 30 form a grid type structure to support the leads 20, and function as a border between adjacent leads of two lead frames.

To form a cavity in a mold used in a resin molding process for a semiconductor package, an upper mold and a lower mold are required to be clamped. In the clamping process, the upper mold applies pressure to the die pad 12 of the lead frame that has been downset at corners of the lead frame. The pressure is transmitted to the four corners of the unit lead frame via the tie bars 15, in directions of arrows A1. Holes 16 are formed at the corners of each unit lead frame, which correspond to the ends of the tie bars 15, and function to absorb the clamping pressure. However, if the unit lead frame is located on an edge or corner of a lead frame matrix, the clamping pressure is not completely absorbed by the holes 16 and is transmitted to adjacent dam bars 30 in the directions of arrows A2.

In general, the dam bar 30 is half-etched to minimize the occurrence of burrs in the cutting portion of a semiconductor package or abrasion of a saw blade during a cutting process after molding of semiconductor packages. A half-etched portion of the dam bar 30 is, however, to be easily deformed by an exterior force. Thus, adjacent dam bars 31 can be deformed by the pressure transmitted in the direction of the arrow A2. The deformation of the dam bars 31 obstructs a precise engagement of an upper mold and a lower mold in the clamping process for molding the lead frame strip with resin. Accordingly, an incomplete engagement of the upper and lower molds can result in generation of mold flash 26, which is a phenomenon in which the leads 20 are covered with resin as illustrated in FIG. 1.

To prevent generation of mold flash, it has been suggested that a lower portion of a lead frame strip is adhered with a film before mounting the lead frame into a mold. This method reduces occurrence of the mold flash but additionally requires attachment and detachment of a film at a bottom portion of a lead frame strip, thereby increasing the manufacturing costs.

SUMMARY OF THE INVENTION

The present invention provides a lead frame strip capable of preventing occurrence of mold flash in a semiconductor package during the fabrication of the semiconductor package using a matrix array package (MAT) method, and a method of fabricating a semiconductor package using the lead frame constructed in accordance with the invention.

The present invention also provides a lead frame strip for use in a semiconductor package, which reduces the manufacturing costs of a semiconductor package, and a method of fabricating a semiconductor package using the lead frame constructed in accordance with the invention.

According to one aspect of the present invention, there is provided a lead frame strip including at least one lead frame panel in which a plurality of unit lead frames are arranged and connected with one another in matrix forms. Each unit lead frame includes a die pad to which a semiconductor chip is to be mounted; a tie bar, an end of which being connected to the die pad and processed to be downset; a plurality of leads positioned generally at the same level as another end of the tie bar and extending with a predetermined distance from the tie pad; a dam bar formed across the leads in a manner to support the leads, wherein at least one slot is formed along edges of the lead frame panel and functions as a buffer, and a connection bar is formed widthwise across the slot to support the lead frame panel.

Preferably, the die pad has one side to which a semiconductor chip is mounted and the other side exposed to the outside.

Preferably, the connection bar is formed at an extension line of the dam bar.

Preferably, the connection bar has a bent portion.

Preferably, the dam bar includes a plurality of concave grooves in a line.

Preferably, the dam bar includes a plurality of concave grooves in a line.

According to another aspect of the present invention, a method of fabricating a semiconductor package is provided, which includes the step of: preparing a lead frame strip that includes at least one lead frame panel in which a plurality of unit lead frames are arranged and connected with one another in matrix forms, wherein each unit lead frame includes a die pad in which a semiconductor chip is to be mounted; a tie bar, an end of which being connected to the die pad and processed to be downset; a plurality of leads positioned generally at the same level as other end of the tie bar and extended with a predetermined distance from the tie pad; a dam bar being formed across the leads in a manner to support the leads, wherein at least one slot is formed along edges of the lead frame panel and functions as a buffer and a connection bar is formed widthwise across the slot to support the lead frame panel. The method further includes the steps of: mounting a semiconductor chip to the die pad; performing wire bonding between the semiconductor chip and the lead and between the semiconductor chip and the die pad; molding the lead frame strip with resin so as to form the encapsulation with the lead frame strip mounted with semiconductor chip and bonded with wires; and cutting the molded lead frame strip into units of lead frames.

Preferably, the die pad has one side to which the semiconductor chip is mounted and the other side exposed to the outside.

Preferably, the method further includes the step of half-etching the lead frame strip to form concave grooves in the dam bar in a line during the preparing of the lead frame strip.

When cutting the molded lead frame strip into units of semiconductor packages, the molded lead frame strip may be cut along the plurality of concave grooves.

During the preparation of a lead frame strip, the method further includes the step of etching or punching the lead frame strip so that a plurality of holes are formed in the dam bar in a line.

When cutting the molded lead frame strip into units of semiconductor packages, the lead frame strip may be cut along the plurality of holes.

BRIEF DESCRIPTION OF THE DRAWINGS

Various other aspects, objects, and advantages of the present invention will become more apparent by the following detailed description of preferred embodiments of the invention with reference to the attached drawings in which.

DETAILED DESCRIPTION OF THE INVENTION

Figure 4:
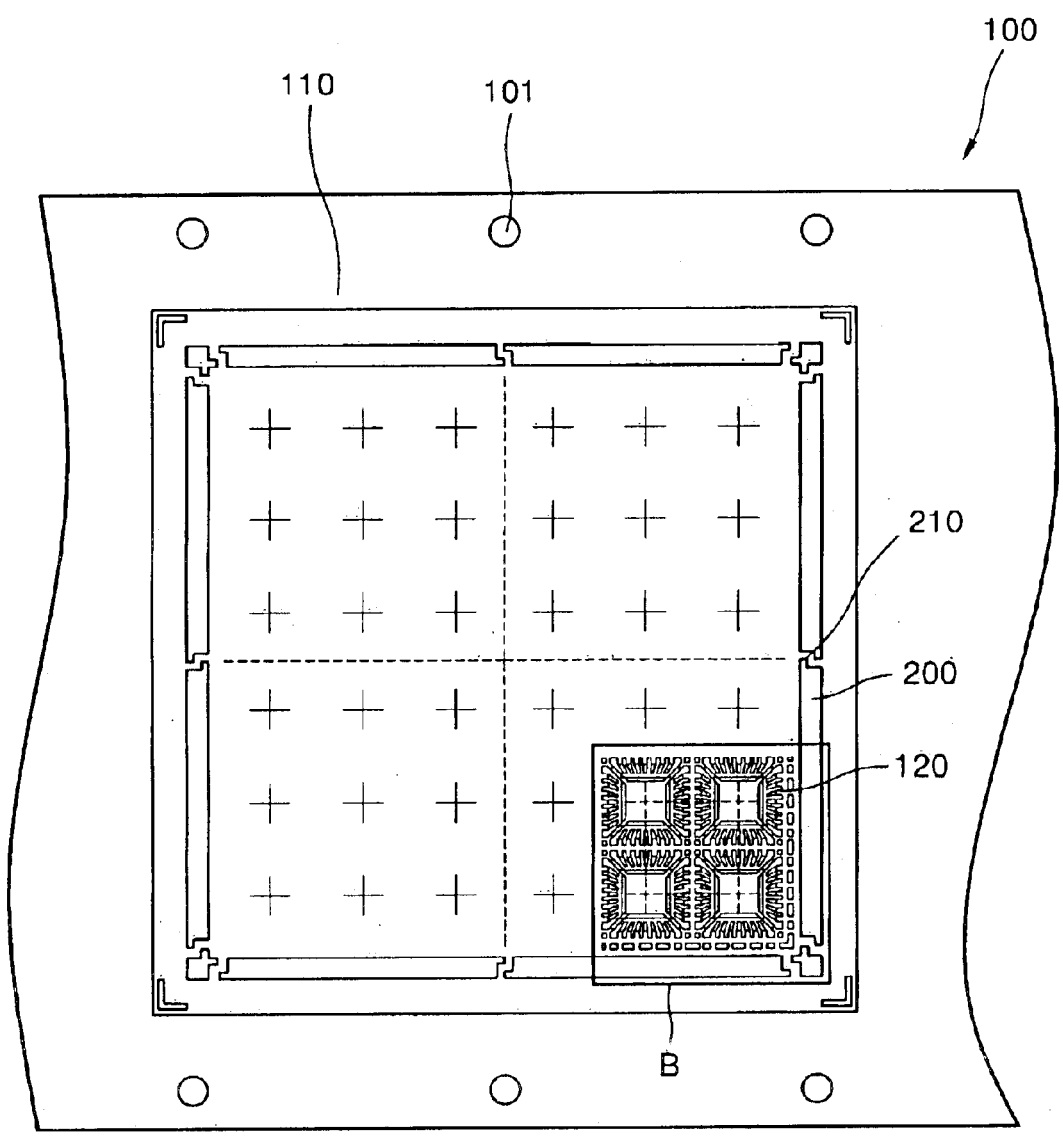
FIG. 4 is a plan view of a lead frame strip according to an embodiment of the present invention.

Referring to FIG. 4, a lead frame strip 100 according to an embodiment of the present invention includes a lead frame panel 110 on which a plurality of unit lead frames 120 are aligned and connected to one another in a matrix form on a plane. The lead frame strip 100 may be used when fabricating a semiconductor package using a matrix array package (MAT) method. For instance, four of the lead frame panels 110 are arranged in a line to form one lead frame strip 100, but only a portion of the lead frame strip 100 is illustrated for convenience in FIG. 4. Position alignment holes 101 are formed along guide rail portions along both sides of the lead frame strip 100.

Long bar-type slots 200 are formed along edges of the lead frame panel 110. The slots 200 are discontinued by connection bars 210 that are formed across the slots 200 so as to support the lead frame panel 110. The connection bars 210 are formed at the extension line of adjacent dam bar. In FIG. 4, the connection bars 210 are illustrated to be preferably formed at the center of each edge of the lead frame panel 110 and at corners of the lead frame panel 110. However, the number and position of the connection bars 210 is not limited to the above description.

Figure 5:
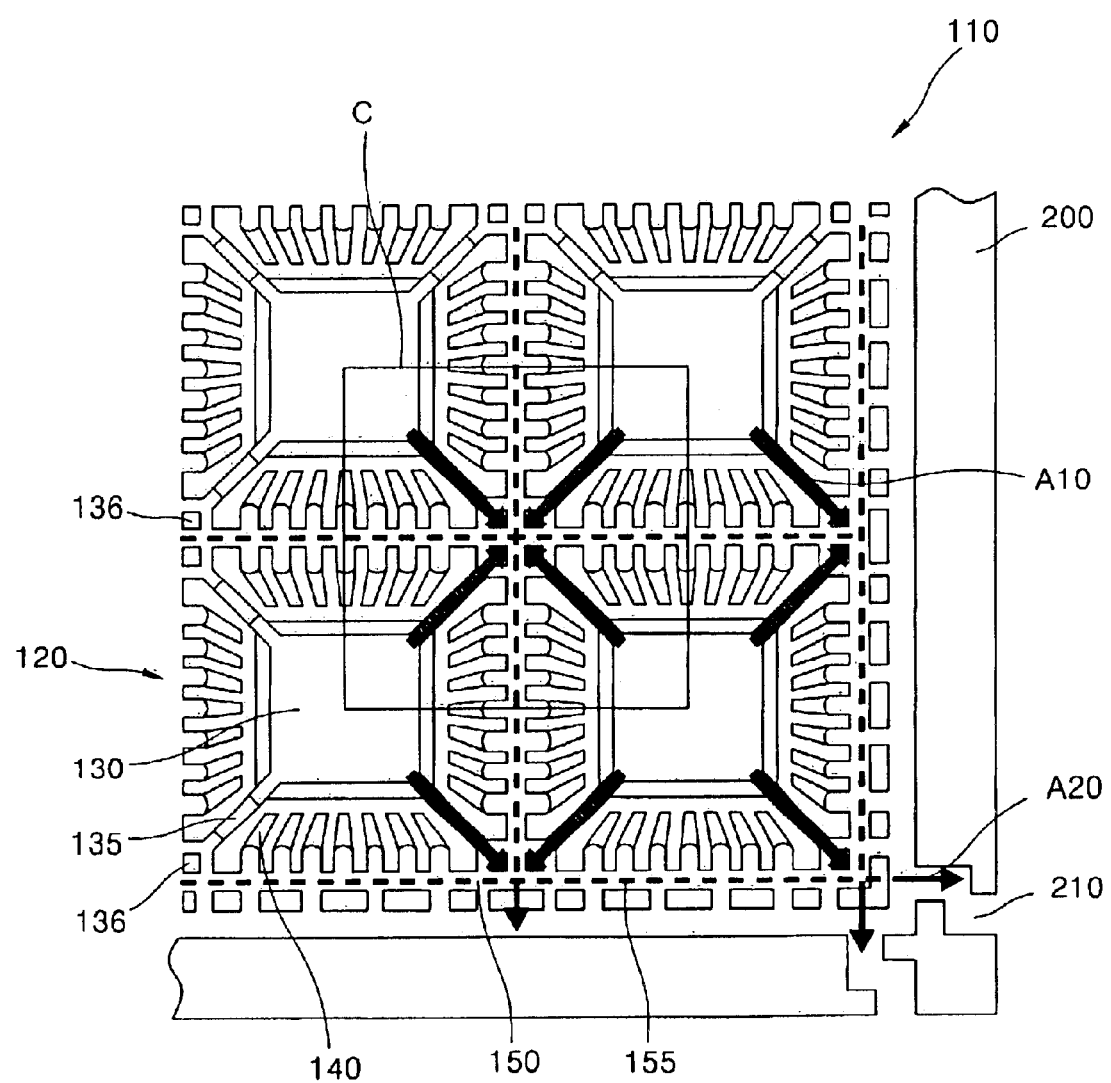
FIG. 5 is a plan view of portion B of the lead frame strip of FIG. 4.

FIG. 5 is an enlarged plan view of portion B of the lead frame panel 110 of FIG. 4. As also shown in FIG. 4, a unit lead frame forming the lead frame panel 110 includes a die pad 130 and tie bars 135 extending downward (i.e., downset) from the die pad 130 in diagonal directions. The unit lead frame further includes leads 140 radially extending with a predetermined distance from the die pad 130, and dam bars 150 which are formed across the leads 140 in a manner to support the leads 140 and bordering adjacent unit lead frames. Adjacent unit lead frames share one dam bar 150 and the dam bars 150 are formed in lattice forms throughout the lead frame panel 110.

Figure 6:
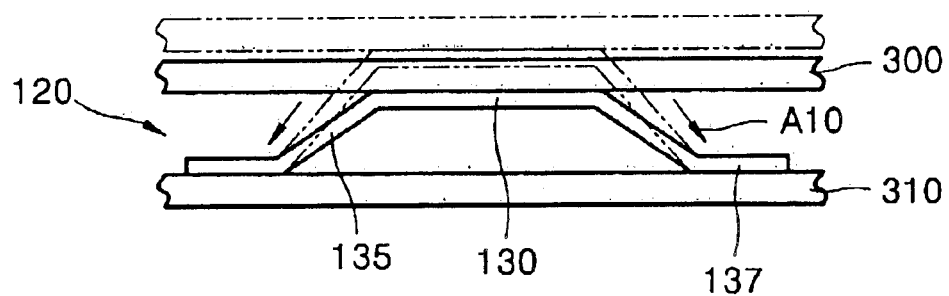
FIG. 6 is a cross-sectional view of a unit lead frame of the lead frame strip of FIG. 5, taken along a diagonal line of the unit lead frame.

FIG. 6 is a schematic cross-sectional view of a unit lead frame of the lead frame strip shown in FIG. 5, taken along a diagonal line across the die pad 130. In detail, FIG. 6 illustrates deformation of a unit lead frame during a molding process of encapsulation, but illustration of the encapsulated unit lead frame is omitted for clarity.

To form the encapsulation, a lead frame strip mounted with semiconductor chips (not shown) is first clamped between an upper mold 300 and a lower mold 310, and then, molding resin is filled into mold cavities formed between the upper and lower molds 300 and 310. As shown in FIG. 6, the upper mold 300 presses the die pad 130 downward during the clamping of the semiconductor chip. In FIG. 6, dotted lines represent an original position of the upper mold 300 and the die pad 130 before the pressing of the upper mold 300. The pressure of the upper mold 300 lowers the position of the die pad 130, and a force indicated by arrow A10 is transmitted to downset corner portions 137 of the lead frame 120 via the tie bars 135.

Referring to FIG. 5, the force is transmitted to the tie bars 135 and concentrates on the corner portions 137 of a unit lead frame as illustrated by A10 in portion C, except for edges of the lead frame panel 110. However, a great amount of the concentrated force is absorbed by holes 136. Also, the forces concentrated on the corner portions 137 of unit lead frames at edges of the lead frame panel 110 would be absorbed by deformation of the slots 200 formed along the edges of the lead frame panel 110. Since the connection bar 210 is formed at an extension line of the dam bar 150, a force indicated with by an arrow A20 is transmitted to the outside of the lead frame panel 110 via the connection bar 210.

Figure 1:
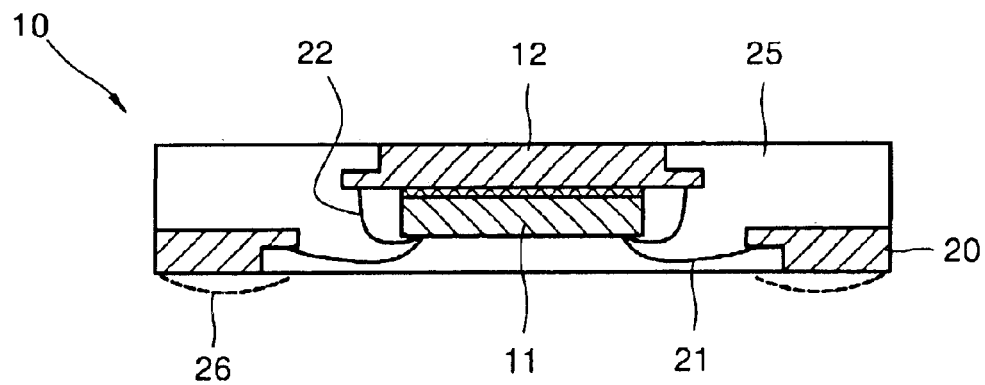
FIG. 1 is a schematic cross-sectional view of a conventional semiconductor package.
Figure 2:
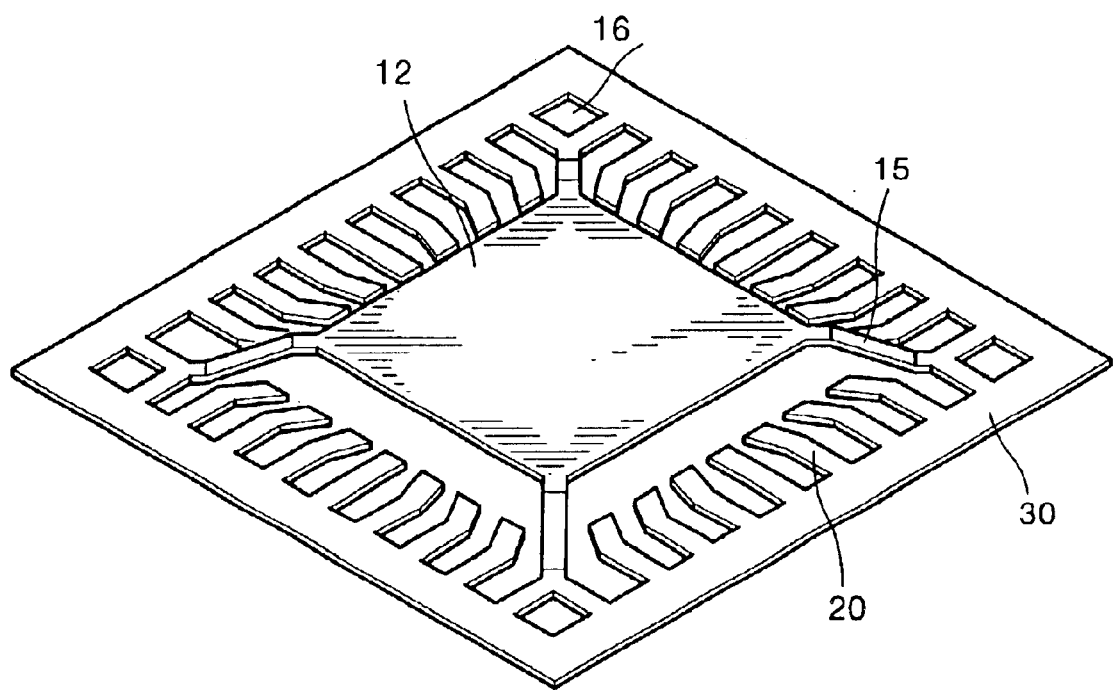
FIG. 2 is a perspective view of a schematic structure of a unit lead frame used in fabricating the semiconductor package of FIG. 1.
Figure 3:
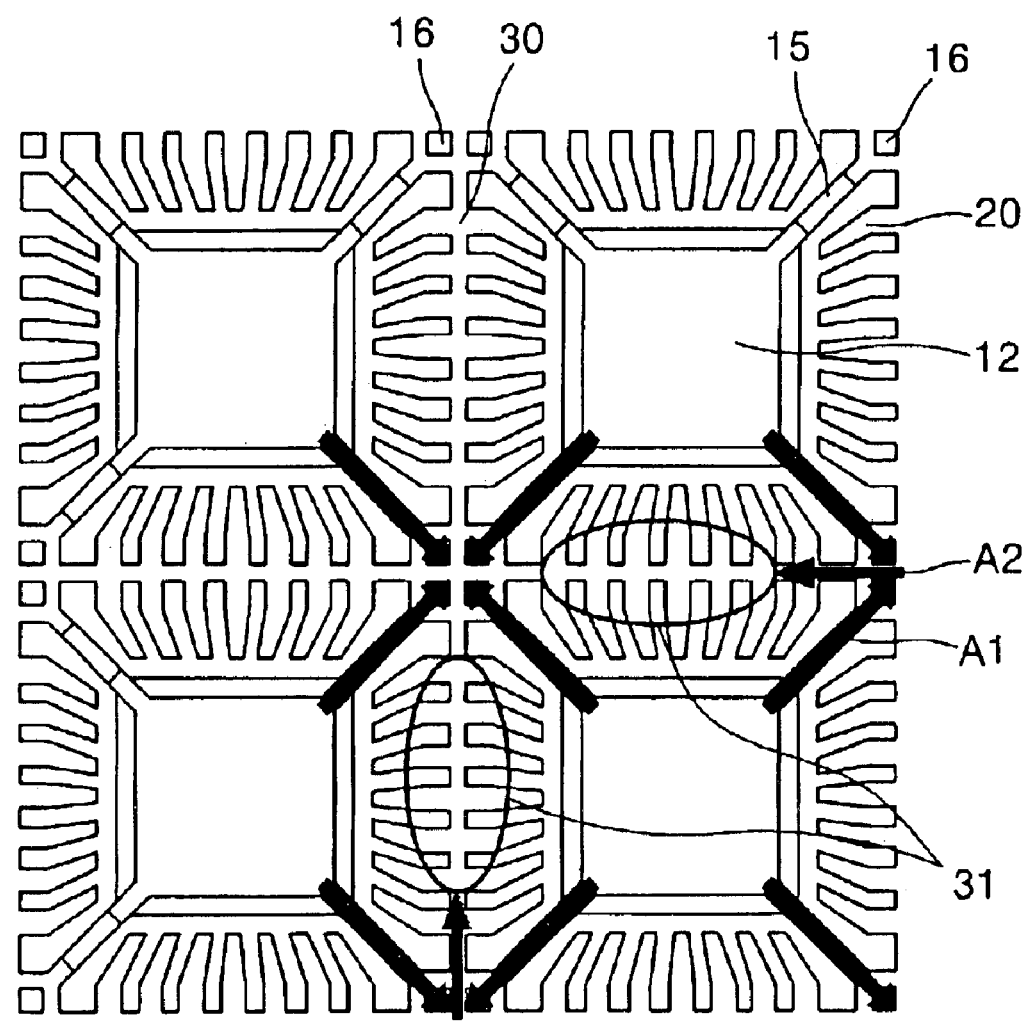
FIG. 3 is a plan view of a portion of a conventional lead frame strip used in fabricating the semiconductor package of FIG. 1.

As shown in FIG. 5, preferably, the connection bar 210 has a bent portion that acts as a buffer to absorb the force through the deformation of the slots 200. In FIG. 5, the bent portion of the connection bar 210 is 'Z' shaped but the shape of the connection bar 210 can be varied. As described above, the occurrence of repulsive power as indicated with the arrow A2 (FIG. 3) can be suppressed by the force absorption by the slot portions, thereby preventing deformation of dam bars adjacent to the edges of the lead frame panel 110.

Figure 7:
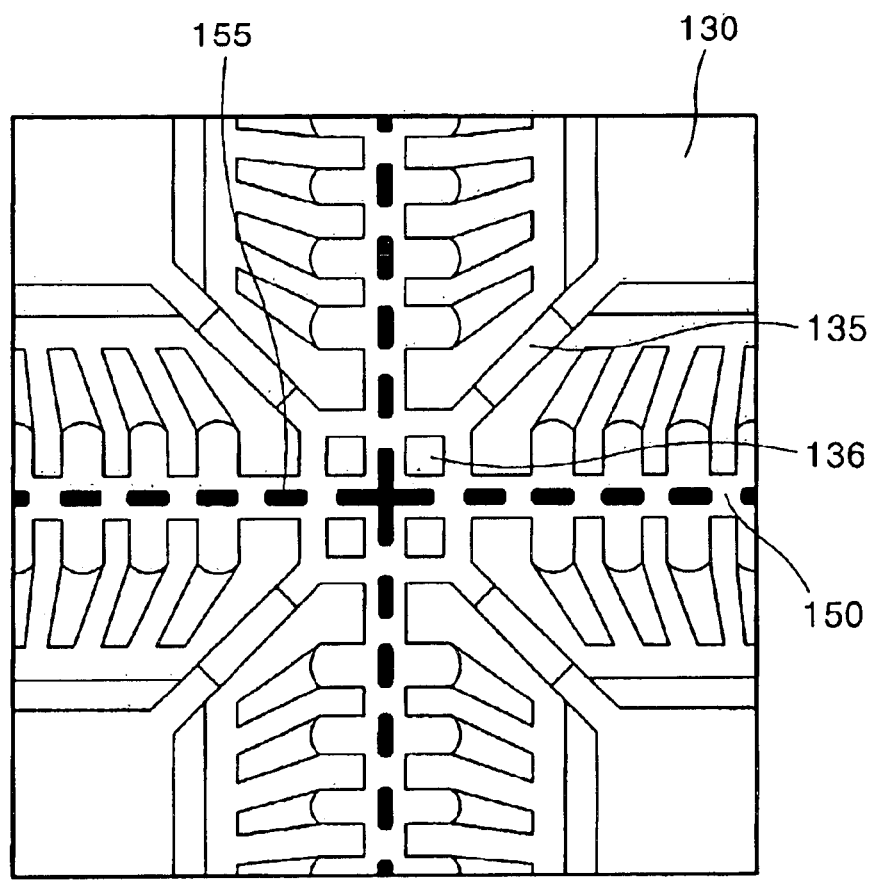
FIG. 7 is a plan view of portion C of FIG. 5.

FIG. 7 is an enlarged plan view of portion C of FIG. 5, where an arrow indicating the direction of a force is omitted for convenience. The dam bar 150 includes concave grooves 155 lengthwise formed in a line. As compared with a conventional half-etched dam bar, the deformation of the dam bar 150 due to its structural weakening can be prevented without causing the occurrence of burrs and abrasion of a saw blade. The grooves 155 may be formed by half etching.

Although not shown in the drawings, holes may be formed instead of the concave grooves 155. The holes are formed at the same position as the concave grooves 155 as shown in FIG. 7 by punctuating the dam bar 50. The holes may be formed by an etching or punching method. After molding of the lead frame strip 100, the lead frame strip 100 is cut into units of semiconductor packages along the concave grooves 155 or the holes.

Figure 8:
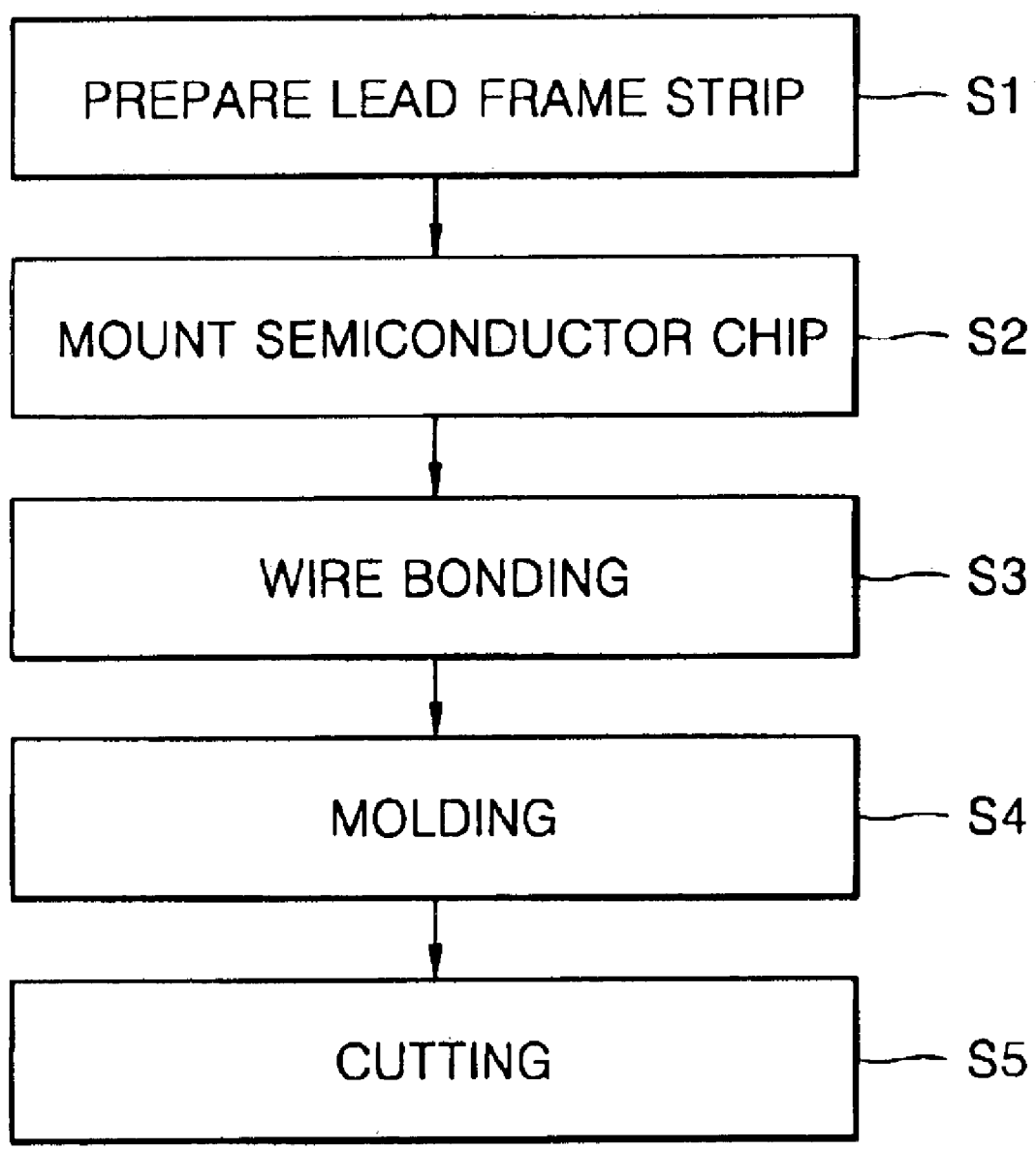
FIG. 8 is a flowchart illustrating a method of fabricating a semiconductor package according to an embodiment of the present invention.

FIG. 8 is a flowchart illustrating a method of fabricating semiconductor packages according to an embodiment of the present invention. Referring to FIG. 8, the method includes preparing a lead frame strip (S1), mounting semiconductor chips (S2), a wire bonding process (S3), a molding process (S4), and a cutting process (S5).

First, a lead frame strip is manufactured to have at least one lead frame panel in which a plurality of unit lead frames are arranged in matrix forms (step 1). Each unit lead frame includes a die pad to which a semiconductor chip is to be mounted; a plurality of tie bars that are extended from the die pad and processed to be down set; a plurality of leads that are positioned at the same level as the end portions of the tie bars and are extended with a predetermined distance from the die pad; a dam bar that is formed across the leads to support the leads. Slots are formed along the edges of the lead frame panel, and connection bars are formed across the slots widthwise to support the lead frame panel. The lead frame strip has already been described in detail and thus its description will be omitted here. The lead frame strip may be formed by half etching or punching.

When preparing the lead frame strip (S1), a plurality of concave grooves are formed on the dam bar. As mentioned above, the plurality of the concave grooves are formed on the dam bar in a line, using half etching. Alternatively, a plurality of holes may be formed in the dam bar, using an etching method or a punching method.

Next, each semiconductor chip is individually cut from a wafer and mounted to a lower portion of a die pad (step S2).

Then, wire bonding is performed to electrically connect the semiconductor chip to the leads and die pad (step S3).

Then, a molding process is performed to encapsulate the semiconductor chip and the lead frame (step S4). Here, as mentioned above, deformation of the dam bar is prevented, thereby exactly forming a cavity between the upper and lower molds. Accordingly, occurrence of mold flash can be prevented.

Lastly, the encapsulated lead frames are cut into units of semiconductor packages, thereby concluding a semiconductor packaging process in which mold flash does not occur. In the cutting process (S5), the encapsulated lead frame panel is cut into units of semiconductor packages along a plurality of concave grooves or a plurality of holes which are formed on or in the dam bar in a line. If the lead frame panel is cut along the concave grooves or holes, it is possible to prevent occurrence of burrs on the cutting portion of a semiconductor package.

Statistical measurement reveals that mold flash occurs in about 35% of semiconductor packages made using the method of fabricating a semiconductor package with a conventional lead frame, whereas the mold flash occurs in about 4% of semiconductor packages made using the method of fabricating a semiconductor package according to the present invention. That is, the method of fabricating a semiconductor package according to the present invention is capable of remarkably reducing occurrence of mold flash.

As described above, utilizing the lead frame and the method of fabricating a semiconductor package using the lead frame, according to the principles of the present invention as described above, it is possible to fabricate a semiconductor package in which generation of mold flash is suppressed.

Further, according to the present invention, additional processes and costs for removing mold flash are not required, thus reducing the costs of fabricating a semiconductor package.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A lead frame strip comprising:

at least one lead frame panel in which a plurality of unit lead frames are arranged, wherein each unit lead frame includes:

a die pad to which a semiconductor chip is to be mounted;

a tie bar for connecting to the die pad, the tie bar having a downset portion;

a plurality of leads arranged about the die pad;

a dam bar formed across the leads in a manner to support the leads, wherein at least one slot is formed along edges of the lead frame panel and functions as a buffer, each slot having a length greater than the length of the die pad of the unit lead frame, and a connection bar extends across the slot to support the lead frame panel.

2. The lead frame strip of claim 1, wherein the die pad has one side to which a semiconductor chip is mounted and the ether side exposed to the outside.

3. The lead frame strip of claim 1, wherein the connection bar is formed at an extension line of the dam bar.

4. The lead frame strip of claim 3, wherein the connection bar has a bent portion.

5. The lead frame strip of claim 2, wherein the dam bar includes a plurality of concave grooves in a line.

6. The lead frame strip of claim 3, wherein the dam bar includes a plurality of concave grooves in a line.

7. The lead frame strip of claim 4, wherein the dam bar includes a plurality of concave grooves in a line.

8. A lead frame strip comprising:

a lead frame panel defined in the lead frame strip, the lead frame panel including a plurality of unit lead frames arranged therein and a plurality of peripheral slots formed along the periphery of the lead frame panel and enclosing the plurality of unit lead frames therein; and wherein each unit lead frame includes a die mounting area for mounting a semiconductor element thereto, at least one dam bar disposed along the periphery of the unit lead frame, at least one tie bar for extending between the die pad and the dam bar, and a plurality of leads disposed about the dam bar, and wherein each of the peripheral slots has a length greater than the length of the die mounting area of the unit lead frame.

9. The lead frame strip of claim 8, wherein the at least one tie bar includes a downset portion.

10. The lead frame strip of claim 9, further including at least one connection bar disposed between the peripheral slots.

11. The lead frame strip of claim 10, wherein the connection bar includes a bent portion.

12. The lead frame strip of claim 11, wherein the dam bar includes a plurality of concave grooves or holes disposed therein.

13. A lead frame strip comprising:

a plurality of unit lead frames formed on the lead frame strip in array;

a plurality of slots formed on the lead frame strip and at least partially enclosing the plurality of unit lead frames therein;

wherein each unit lead frame includes a die mounting area for attaching a semiconductor element thereto, at least one dam bar disposed between the adjacent unit lead frames, at least one tie bar for extending between the die mounting area and the dam bar, and a plurality of leads disposed about the dam bar, and wherein each of the slots has a length greater than the dimension of the semiconductor element to be mounted on the unit lead frame.

* * * * *